(«12») United States Patent
Si et al.

(10) Patent No.: US 8,402,323 B2
(45) Date of Patent: *Mar. 19, 2013

(54) SYSTEM AND METHOD FOR IN-LINE ERROR CORRECTION FOR STORAGE SYSTEMS

(75) Inventors: Yujun Si, Tustin, CA (US); Theodore Curt White, Rancho Santa Margarita, CA (US); Stanley Ka Fai Cheong, Lake Forest, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 13/400,321

(22) Filed: Feb. 20, 2012

(65) Prior Publication Data

US 2012/0192036 A1 Jul. 26, 2012

Related U.S. Application Data

(63) Continuation of application No. 11/231,312, filed on Sep. 20, 2005, now Pat. No. 8,122,299, which is a continuation of application No. 10/199,911, filed on Jul. 19, 2002, now Pat. No. 6,961,877.

(51) Int. Cl.
 *G06F 11/00* (2006.01)
(52) U.S. Cl. .......................... 714/49; 714/805
(58) Field of Classification Search .................. None
 See application file for complete search history.

(56) References Cited

U.S. PATENT DOCUMENTS

| | | | |
|---|---|---|---|
| 4,080,649 A | 3/1978 | Calle et al. | |
| 4,851,993 A * | 7/1989 | Chen et al. | 711/138 |
| 5,025,366 A | 6/1991 | Baror | |
| 5,285,451 A | 2/1994 | Henson et al. | |
| 5,602,857 A | 2/1997 | Zook et al. | |
| 5,691,994 A | 11/1997 | Acosta et al. | |
| 5,912,906 A | 6/1999 | Wu et al. | |
| 5,943,348 A * | 8/1999 | Ly | 714/761 |
| 5,995,121 A | 11/1999 | Alcorn et al. | |
| 6,092,231 A | 7/2000 | Sze | |
| 6,115,837 A | 9/2000 | Nguyen et al. | |
| 6,163,871 A * | 12/2000 | Yang | 714/769 |
| 6,192,499 B1 | 2/2001 | Yang | |
| 6,249,492 B1 * | 6/2001 | Mattes | 369/30.23 |
| 6,330,626 B1 | 12/2001 | Dennin et al. | |
| 6,405,342 B1 * | 6/2002 | Lee | 714/792 |
| 6,415,358 B1 | 7/2002 | Arimilli et al. | |
| 6,470,461 B1 | 10/2002 | Pinvidic et al. | |
| 6,564,291 B1 | 5/2003 | Bassett | |
| 6,606,717 B1 * | 8/2003 | Yu et al. | 714/42 |

(Continued)

FOREIGN PATENT DOCUMENTS

JP 402148127 A 6/1990

OTHER PUBLICATIONS

Microsoft Press Computer Dictionary Third Edition, "buffer", Microsoft Press, 1997, pp. 66.
Microsoft Press Computer Dictionary Third Edition, "first in first out", Microsoft Press, 1997, pp. 198.

*Primary Examiner* — Gabriel Chu

(57) ABSTRACT

A disk controller comprising a disk formatter configured to receive data being transferred between a disk and a host. A buffer controller is in communication with the disk formatter, a buffer configured to store the data being transferred between the disk and the host, and the host. The buffer is external to each of the disk controller and the host. The buffer controller is configured to regulate transfer of the data between the buffer and the disk formatter. An error correction module is in communication with the disk formatter and the buffer controller. The error correction module is configured to generate an error correction mask to correct errors in the data. The error correction mask is applied to the data prior to the buffer controller transferring the data to the buffer.

14 Claims, 11 Drawing Sheets

U.S. PATENT DOCUMENTS

| | | | |
|---|---|---|---|
| 6,625,774 B1 * | 9/2003 | Yang | 714/755 |
| 6,662,334 B1 | 12/2003 | Stenfort | |
| 6,728,824 B1 | 4/2004 | Chen | |
| 6,993,688 B2 | 1/2006 | Su et al. | |
| 7,111,228 B1 | 9/2006 | Ricci | |
| 2002/0083393 A1 * | 6/2002 | Hall et al. | 714/785 |
| 2002/0166090 A1 * | 11/2002 | Maeda et al. | 714/746 |

* cited by examiner

*Interleave 0*

SYSTEM AND METHOD FOR IN-LINE ERROR CORRECTION FOR STORAGE SYSTEMS

CROSS-REFERENCE TO RELATED APPLICATIONS

This application is a continuation of U.S. patent application Ser. No. 11/231,312 filed on Sep. 20, 2005, which is a continuation of U.S. patent application Ser. No. 10/199,911, filed on Jul. 19, 2002, and issued as U.S. Pat. No. 6,961,877. The disclosures of the above applications are incorporated herein by reference in their entirety.

FIELD

The present invention relates generally to disk controllers, and more particularly to in-line error correction before a host system transfers data to an external buffer during a read operation.

BACKGROUND

Conventional computer systems typically include several functional components. These components may include a central processing unit (CPU), main memory, input/output ("I/O") devices, and disk drives. In conventional systems, the main memory is coupled to the CPU via a system bus or a local memory bus. The main memory is used to provide the CPU access to data and/or program information that is stored in main memory at execution time. Typically, the main memory is composed of random access memory (RAM) circuits. A computer system with the CPU and main memory is often referred to as a host system.

The main memory is typically smaller than disk drives and may be volatile. Programming data is often stored on the disk drive and read into main memory as needed. The disk drives are coupled to the host system via a disk controller that handles complex details of interfacing the disk drives to the host system. Communications between the host system and the disk controller is usually provided using one of a variety of standard I/O bus interfaces.

Typically, a disk drive includes one or more magnetic disks. Each disk typically has a number of concentric rings or tracks on which data is stored. The tracks themselves may be divided into sectors, which are the smallest accessible data units. A positioning head above the appropriate track accesses a sector. An index pulse typically identifies the first sector of a track. The start of each sector is identified with a sector pulse. Typically, the disk drive waits until a desired sector rotates beneath the head before proceeding a read or write operation. Data is accessed serially, one bit at a time and typically, each disk has its own read/write head.

The disk drive is connected to the disk controller that performs numerous functions, for example, converting digital data to analog head signals, disk formatting, error checking and fixing, logical to physical address mapping and data buffering. To perform the various functions for transferring data, the disk controller includes numerous components.

Typically, the data buffering function is used to transfer data between the host and the disk. Data buffering is needed because the speed at which the disk drive can supply data or accept data from the host is different than the speed at which the host can correspondingly read or supply data. Conventional systems include a buffer memory that is coupled to the disk controller. The buffer memory temporarily stores data that is being read from or written to the disk drive.

Conventionally, when data is read from the disk drive, a host system sends a read command to the disk controller, which stores the read command into the buffer memory. Data is read from the disk drive and stored in the buffer memory. An ECC module determines the errors that occur in the data and appropriately corrects those errors in the buffer memory. Once it is determined that there are no errors, data is transferred from the buffer memory to the host system.

The conventional read process causes performance bottlenecks because data stays in the buffer memory while the ECC module performs the error checking and/or fixing. If there are any errors, data is pulled back from the buffer memory, the error is fixed and the data with no errors is sent back to the buffer memory so that it can be sent to the host. Because data has to move, to and from the buffer memory, it causes delay in the overall performance.

Therefore, what is desired is an error correction system that locates and corrects error before data is transferred to a buffer memory for subsequent transfer to a host system.

SUMMARY

The present invention solves the foregoing drawbacks by providing a system for performing in-line error correction in a disk storage system. The system includes an error correction module; and a first memory storage device, wherein the first memory storage device and the error correction module simultaneously receive data from a storage disk before data is buffered for transfer to a host system. The ECC module provides error correction mask and the error is corrected before any data is transferred from the first memory storage device to a second memory buffer. The ECC module includes a module for generating error location and error mask information associated with data that is read from the storage device. The error location and error mask information is interleaved.

In another aspect, the present invention provides a method for error correction during a read operation in a disk storage system. The method includes, receiving data from a disk storage device, wherein the data is received simultaneously by an error correction module and a first memory buffer; and generating error location and error mask information, prior to transferring any data from the first memory buffer to a second memory buffer.

In one aspect of the present invention, error correction is performed before any data is transferred from the buffer controller to a buffer memory. This eliminates the extra operations that may be required during a read operation.

This brief summary has been provided so that the nature of the invention may be understood quickly. A more complete understanding of the invention can be obtained by reference to the following detailed description of the preferred embodiments thereof in connection with the attached drawings.

BRIEF DESCRIPTION OF DRAWINGS

The foregoing features and other features of the present invention will now be described with reference to the drawings of a preferred embodiment of a disk drive. In the drawings, the same components have the same reference numerals. The illustrated embodiment is intended to illustrate, but not to limit the invention. The drawings include the following Figures.

DESCRIPTION

To facilitate an understanding of the preferred embodiment, the general architecture and operation of a disk drive will initially be described. The specific architecture and operation of the preferred embodiment will then be described with reference to the general architecture and operation of a disk drive.

Figure 1:
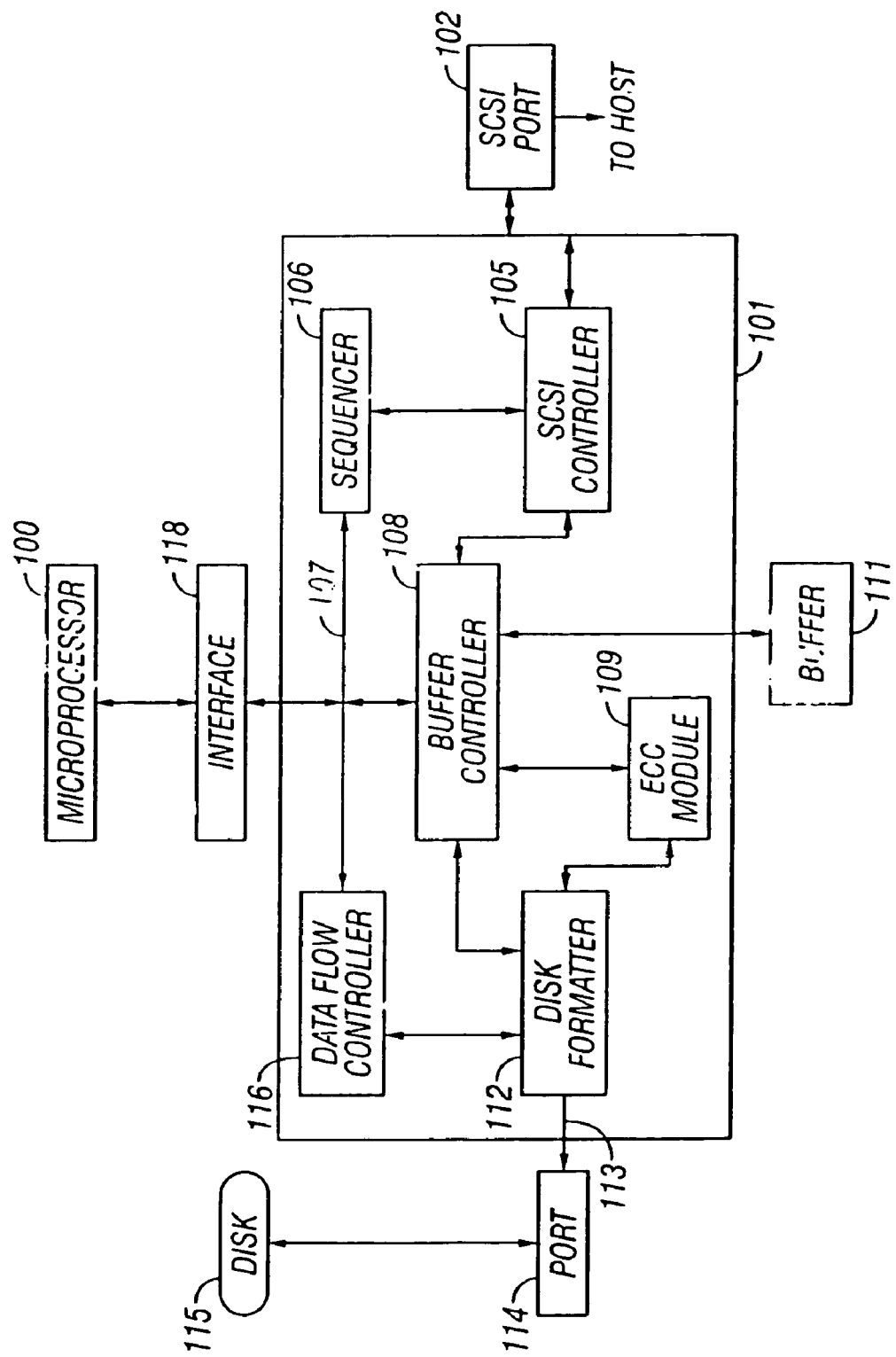
FIG. 1 shows a block diagram of a disk storage system

The disk drive system of FIG. 1 is an example of an internal (hard) disk drive included in a computer system. The host computer (not shown) and the disk drive communicate via port 102, which is connected to a data bus (not shown). In an alternate embodiment (not shown), the disk drive is an external storage device, which is connected to the host computer via a data bus. The data bus, for example, is a bus in accordance with a Small Computer System Interface 10 (SCSI) specification. Those skilled in the art will appreciate that other communication buses known in the art can be used to transfer data between the disk drive and the host system.

As shown in FIG. 1, the disk drive includes disk controller 101, which is coupled to SCSI port 102, disk port 114, buffer memory 111 and microprocessor 100. Interface 118 serves to couple microprocessor bus 107 to microprocessor 100. A read only memory ("ROMu") omitted from the drawing is used to store firmware code executed by microprocessor 100. Disk port 114 couples disk controller 101 to disk 115.

As is standard in the industry, data is stored on disk 115 in sectors. Each sector is byte structured and includes various fields, referred to as the sector format. A typical sector format includes a logical block address ("LBAu") of about four bytes followed by a data field of about 512 bytes. The LBA contains position information, for example, cylinder, head and sector numbers. A field for a CRC checksum of 4 bytes typically follows the data field. A subsequent field for a number of ECC bytes, for example 40-80 bytes, is located at the end of the sector.

Controller 101 can be an integrated circuit (IC) that comprises of various functional modules, which provide for the writing and reading of data stored on disk 115. Microprocessor 100 is coupled to controller 101 via interface 118 to facilitate transfer of data, address, timing and control information. Buffer memory 111 is coupled to controller 101 via ports to facilitate transfer of data, timing and address information.

Data flow controller 116 is connected to microprocessor bus 107 and to buffer controller 108. An ECC module 109 and disk formatter 112 are both connected to microprocessor bus 107. Disk formatter 112 is also coupled to data and control port 113 and to data bus 107.

SCSI controller 105 includes programmable registers and state machine sequencers that interface with SCSI port 102 on one side and to a fast, buffered direct memory access (DMA) channel on the other side.

Sequencer 106 supports customized SCSI sequences, for example, by means of a 256-location instruction memory that allows users to customize command automation features. Sequencer 106 is organized in accordance with the Harvard architecture, which has separate instruction and data memories. Sequencer 106 includes, for example, a 32-byte register file, a multi-level deep stack, an integer algorithmic logic unit (ALU) and other special purpose modules. Sequencer 106 supports firmware and hardware interrupt schemes. The firmware interrupt allows microprocessor 100 to initiate an operation within sequencer 106 without stopping sequencer operation. Hardware interrupt comes directly from SCSI controller 105.

Disk formatter 112 is a disk interface controller and performs control operations when microprocessor 100 loads all required control information and parameter values into a writable control store (WCS) RAM (not shown) and issues a command. Disk formatter 112 executes the command with no microprocessor 100 intervention.

Buffer controller 108 can be a multi-channel, high speed DMA controller. Buffer controller 108 connects buffer memory 111 to disk formatter 112 and to an ECC channel of ECC module 109, a SCSI channel of SCSI controller 105 and micro-controller bus 107. Buffer controller 108 regulates data movement into and out of buffer memory 111.

To read data from disk 115, a host system sends a read command to disk controller 101, which stores the read command in buffer memory 111. Microprocessor 100 then reads the command out of buffer memory 111, and initializes the various functional blocks of disk controller 101. Data is read from disk 115 and is passed through disk formatter 112 simultaneously to buffer controller 108 and to ECC module 109. Thereafter, ECC module 109 provides the ECC mask for errors, which occurred during the read operation, while data is still in buffer controller 108. The error is corrected and corrected data is sent to buffer memory 111, and then passed to the host system.

Figure 2A:
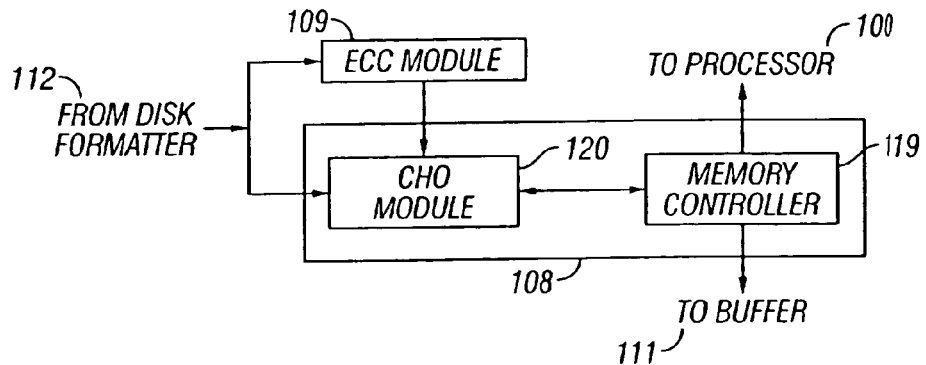
FIGS. 2A shows a block diagram of an ECC module and a buffer controller, according to an aspect of the present invention.

ECC module 109, as shown in FIG. 2A provides error correction mask to correct errors, before any data is sent to buffer memory 111. This is accomplished by appending a predefined number of data bytes of ECC code called check bytes to the end of a data block during a write operation. During a read operation, the data with ECC check bytes are passed through ECC module 109 and are used to correct errors in data. ECC module 109 also provides the error correction mask based on SYNDROME that may occur during the read operation.

ECC module 109 is coupled to buffer controller 108. Data from disk 115 is received simultaneously by ECC module 109 and buffer controller 108, before being transferred to buffer memory 111. Buffer controller 108 stores incoming data in a FIFO based memory 120B within CH0 module 120. Memory controller 119 controls the operation of various buffer controller 108 components, as discussed below.

Figure 2B:
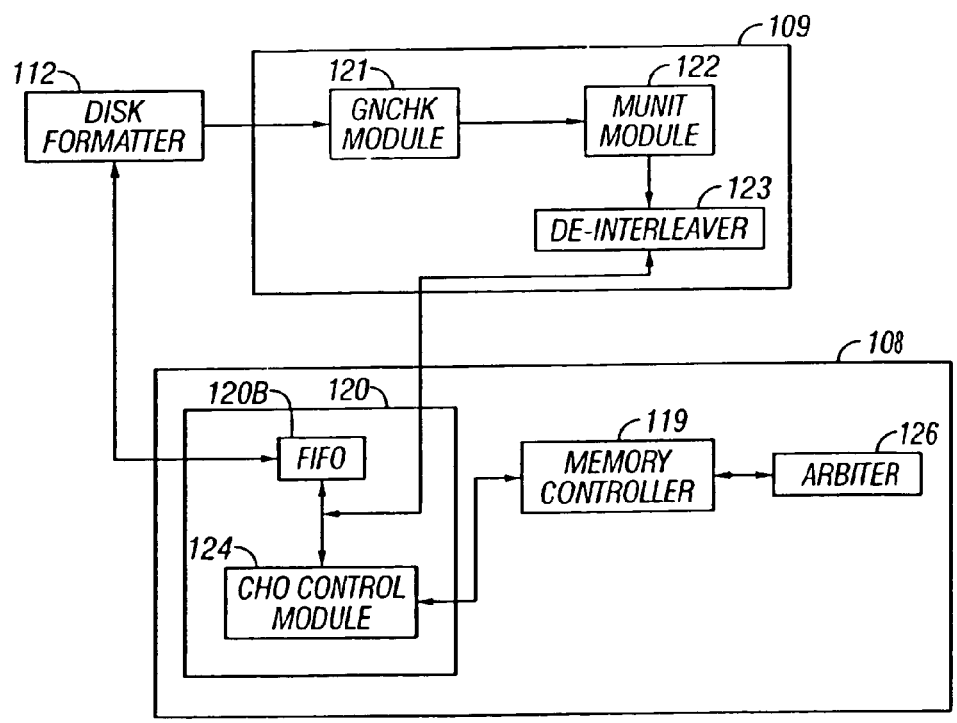
FIG. 2B shows a block diagram of the ECC module and buffer controller of FIG. 2A.

FIG. 2B shows another block diagram of ECC module 109 and buffer controller 108 components, according to one aspect of the present invention. GNCHK module 121 of ECC module 109, and FIFO memory 120B located in CH0 module 120A simultaneously receive data from disk formatter 112.

Math Unit (MUNIT) 122 generates error location data and the error masks and transfers the error location and masks to an Error Mask De-interleaver 123. As discussed below, error mask is applied to data having errors, while data is transferred from FIFO memory 120B to buffer memory 111.

Arbiter 126 arbitrates requests from competing components to access the same DMA channels.

Figure 2C:
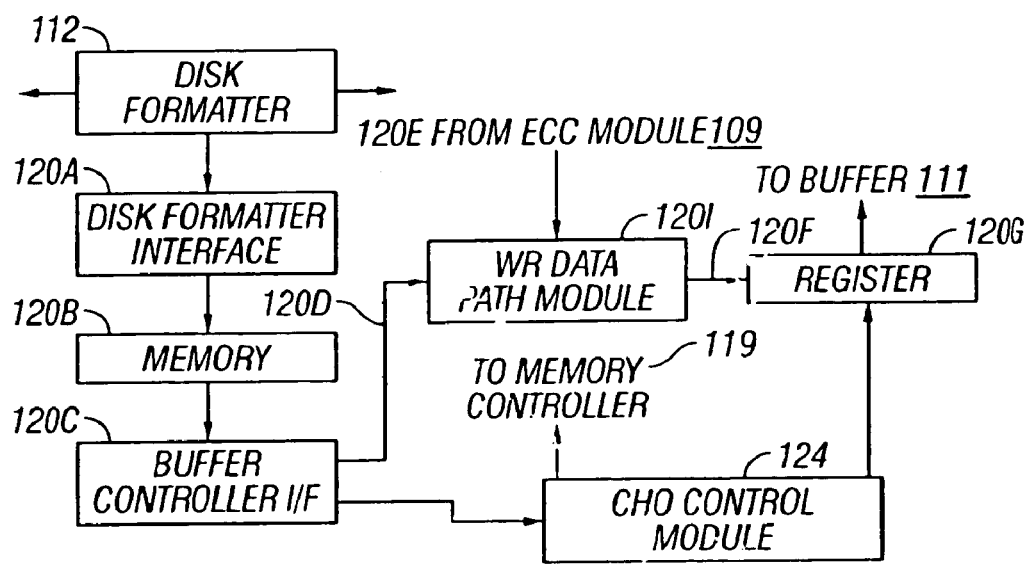
FIG. 2C shows a block diagram of a CH0 module, according to one aspect of the present invention.

FIG. 2C is a block diagram showing various components of CH0 module 120. CH0 module 120 includes a disk formatter interface 120A that receives data from disk formatter 112 and passes the data to FIFO 120B. A buffer controller interface 120C is provided to interface CH0 module 120 with memory controller 119 via a CH0 control module 124.

Also included in CH0 module 120 is a WR data path module 120I that receives error correction mask 120E from ECC module 109 and uncorrected error 120D from FIFO 120B via buffer controller interface 120C. Data 120D and error mask 120R are XORed by WR data path module 120I and corrected data 120F is sent to a register 120G, and thereafter transferred to buffer 111.

Figure 2D:
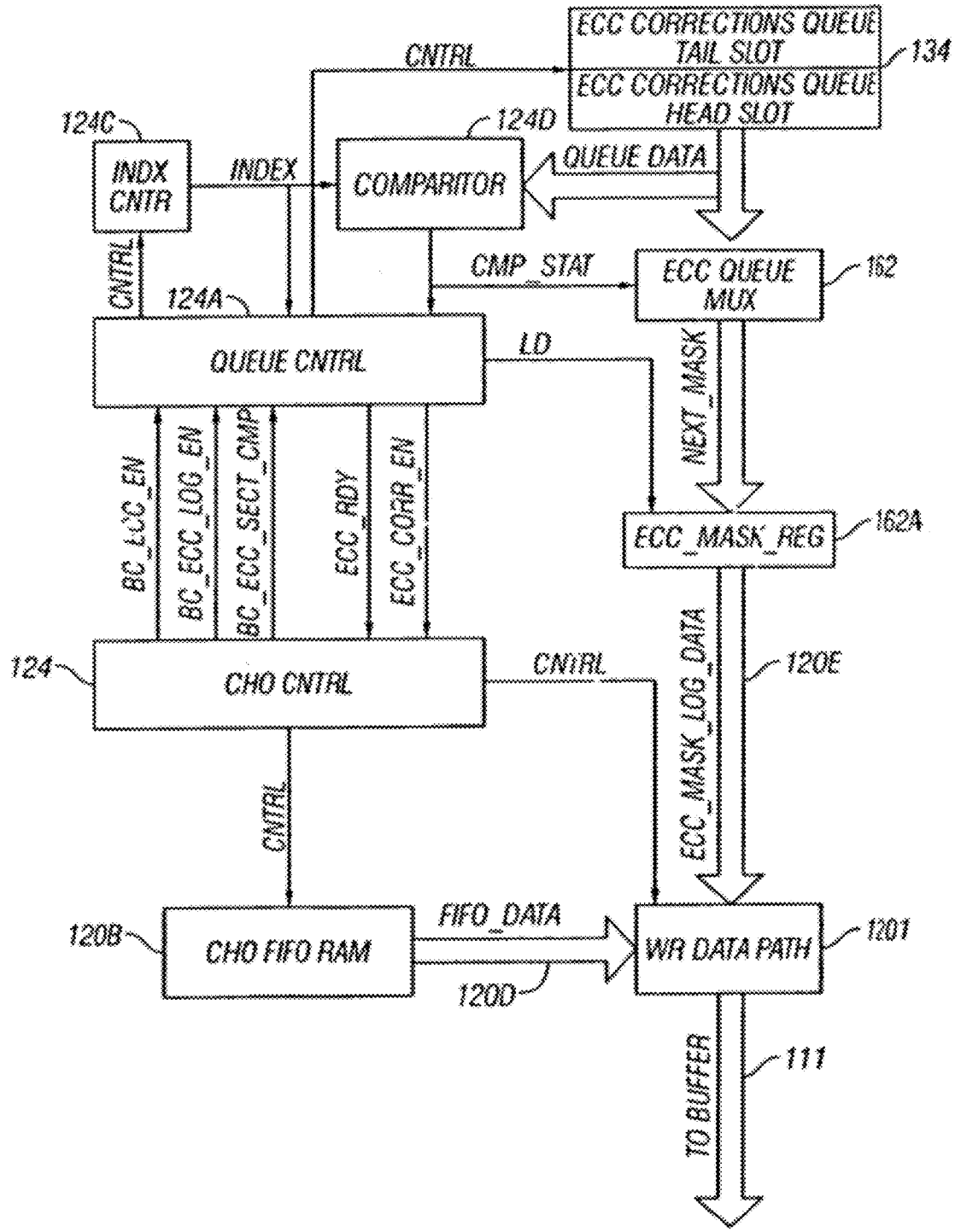
FIG. 2D shows a detailed block diagram of the CH0 module with various components of the ECC module, according to one aspect of the present invention.
Figure 2E:
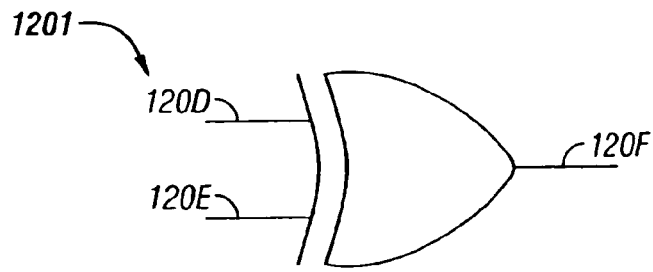
FIG. 2E is an example of applying error mask, according to one aspect of the present invention.

FIG. 2D shows various CH0 120 components with ECC module 109 components that are used for performing in-line error correction. CH0 control module 124 uses a queue control block 124, which is a part of ECC module 109 to access error mask 120E via error queue 134, MUX 162 (also shown in FIG. 9) and error mask register 162A. Plural commands between CH0 control module 124 are described below. As shown in FIG. 2E. Uncorrected data from FIFO 120B is XORed by WR data path module 120I with error mask 120E. Corrected data is then sent to buffer memory 111.

Figure 3:
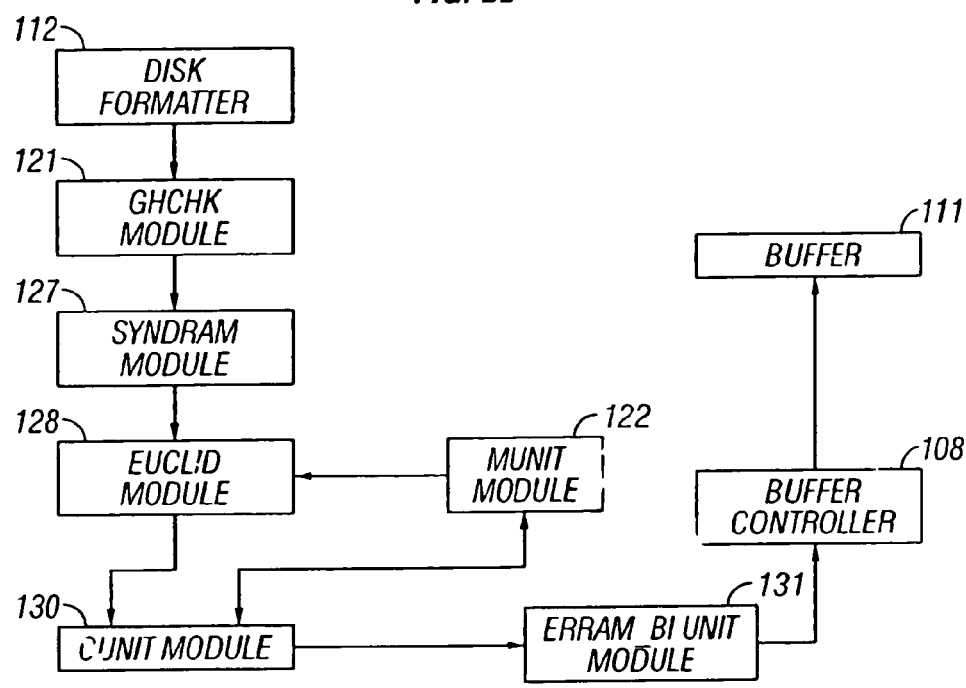
FIG. 3 shows a block diagram of the ECC module with various other components, according to an aspect of the present invention.

FIG. 3 is a block diagram showing various components of ECC module 109 including GNCHK module 121, SYNDRAM Generator 127, EUCLID module 128, MUNIT module 122, and CUNIT module 130, according to one aspect of the present invention. In order to understand the functionality of various FIG. 3 modules, it will be helpful to understand interleaving, as used in memory storage devices.

Interleaving is a scheme that arranges code word symbols so that the symbols from any given code word are well separated. The interleave technique allows effective use of random ECC over plural burst channels. Interleaved code words are reconstructed by a de-interleaver, described below, and error bursts are spread across several interleaved code words.

In one aspect, as described below, the present system can use an Interleave mode of 4, 6 or 8. GNCHK module 121 interleaves disk data received from disk formatter 112, and thereafter, other ECC module 109 components process the interleaved data. SYNDROME or error information is stored with respect to individual interleaves. Error information is de-interleaved by ERRRAM-BI unit 131 (same as the De-Interleaver 123 in FIG. 2B}, to match actual physical data location.

Turning now in detail to FIG. 3, for a read operation disk formatter 112 passes data from disk 115 to GNCHK module 121 which generates a partial SNYDRAM value. If partial SYNDRAM value is not all zero, it indicates that data may have error. Partial SYNDRAM is saved in SYNDRAM generator 127, which initializes MUNIT module 122. MUNIT module 122 utilizes EUCLID module 128 to determine error location and error evaluation polynomials. CUNIT 130 uses these polynomials to compute error locations and generates error masks to correct the errors. The error locations and error masks are transferred to a memory unit within ERRRAM BI unit 131 and then sent to WR data path module 120I (FIG. 20).

The basis of error detection and correction of date stored in disk 115 is the inclusion of the error correction code. As discussed above, typically, each sector of disk 115 contains 512 bytes or 4,096 bits of date. In addition to these bits, an additional number of bits are added to each sector for implementing the error correction code. The additional bits do not contain data, rather they contain data that can be used to correct any errors encountered in reading data from disk 115.

Various error correcting codes are used to correct disk related errors. One such technique is the "Reed-Solomon" technique that is widely used for error detection and correction in disk storage media like disk 115. Error correction codes are generated using the Reed Solomon encoding technique when data is written to disk 115 sectors. When the data is read back, errors that can be corrected are corrected using the Reed-Solomon de-coding algorithm. It is noteworthy that the present invention is not limited to the Reed-Solomon algorithm, any error correction code generation system may be used to implement the various aspects of the present invention.

Figure 4:
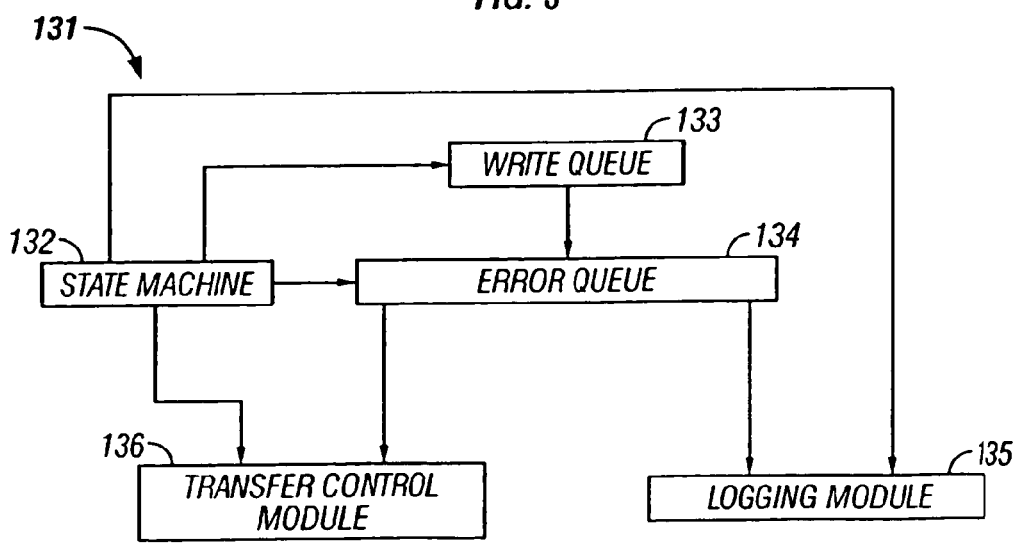
FIG. 4 shows a block diagram of an error logging system, according an aspect of the present invention.

FIG. 4 shows a block diagram of ERRRAM BI unit 131 that receives error information and prepares the error mask based on the error information during data transfer. ERRRAM BI unit 131 includes a state machine 132 that receives error location and mask information from CUNIT 130, and transfers it to a write queue 133 which is then transferred to Error Queue 134 that stores the error location and error mask information.

Transfer control module 136 provides the corrected error mask when data is transferred to Buffer Controller 108. Error logging module 135 controls the error logging function discussed below.

Error queue 134 saves error location and mask information either in an interleaved format or in a byte-link queue. In the. interleaved format, error location is saved as an interleaved address, while in the byte-link queue, absolute error location address is used. The interleaved scheme, reduces the number of gates and hence cost.

Figure 5:
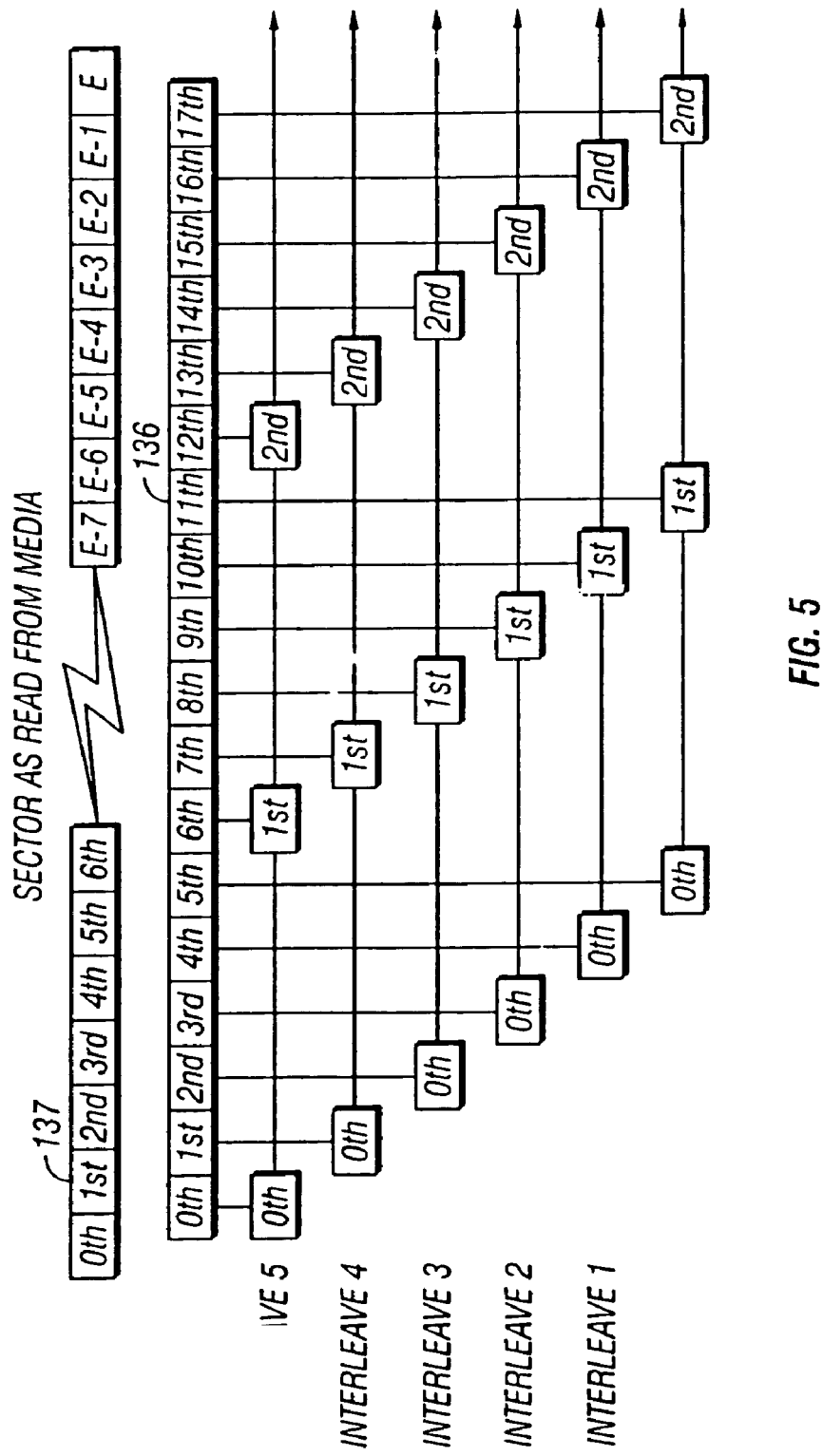
FIG. 5 shows an interleaving example according to an aspect of the present invention.

FIG. 5 provides an example of the addressing scheme with respect to the actual data that is read from disk 115 sectors, in an interleave format. FIG. 5 shows a six data block interleave system 137. Data 136 includes data 0 through 17 as stored on disk 115. Interleave 5 includes data 0, 6 and 12 and so forth. Interleave 4 includes data 1, 7, 13 and so forth. FIG. 5 is only to illustrate one aspect of the present invention and is not intended to limit the invention to a particular interleave size. For example, interleave 4 and/or 8 data block systems may be used to provide error location and mask.

Figure 6:
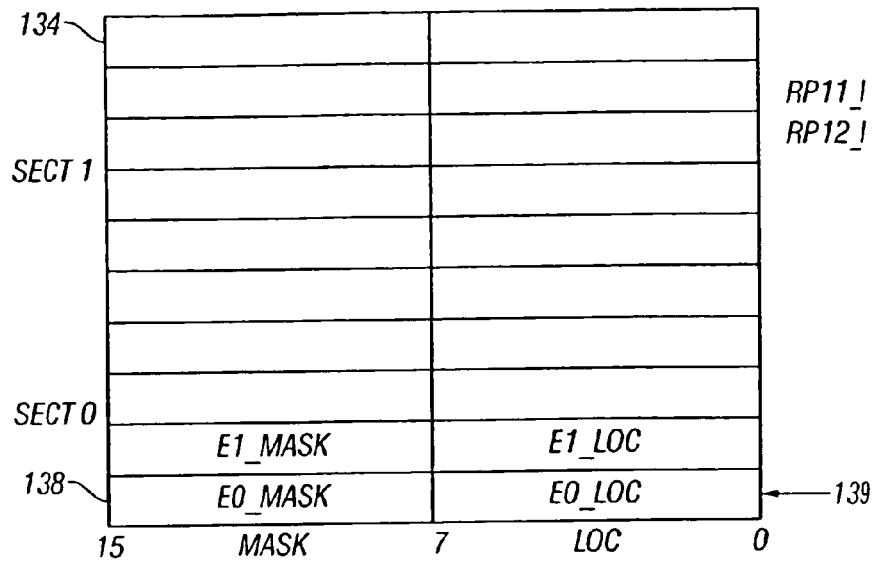
FIG. 6 shows an example of storing error location and error mask information, according to an aspect of the present invention.

FIG. 6 shows an example of error queue 134 with error location 139 and error mask 138 information in an interleave bank, e.g. interleave 0. A write segment of error queue 134 writes error information and generates initial pointers RP01 I and RP02 I. State machine 132 generates a read pointer when error queue 134 is read. Pointer values are increased incrementally as error locations and error masks are populated in individual interleave banks in error queue 134.

Figure 7A:
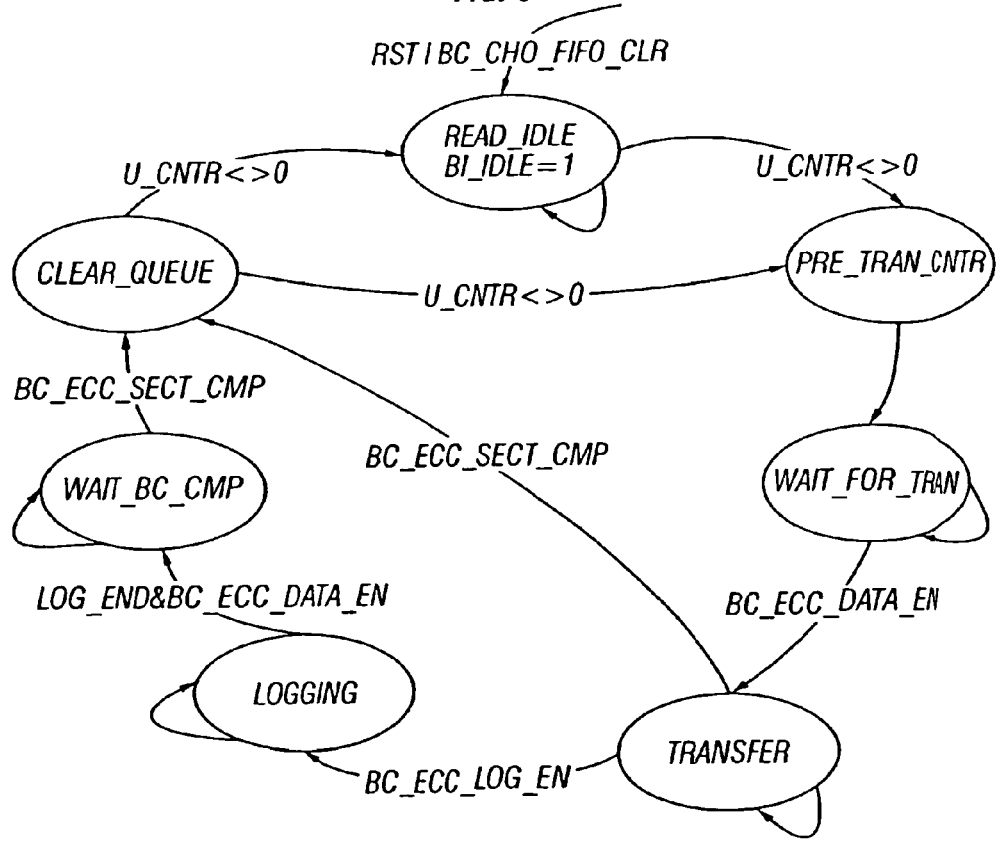
FIG. 7A shows various commands (or signals) used by the system according to one aspect of the present invention.

FIG. 7A shows various signals (or state machine commands) that are used in one aspect of the present invention to perform ECC when data is transferred to buffer memory 111 through buffer controller 108. The following interface signals are described below with reference to FIG. 7A.

ECC_BC_RDY:

This signal is generated by ECC module 109. When this signal is active, it indicates that at least one sector of data is available to be processed for inline corrections, and/or error logging, if enabled. It also indicates that the ECC data path is ready for the first BC_ECC_DATEN (defined below) active clock.

ECC-CORR-EN:

This signal is driven by ECC module 109 and defined when ECC_BC_RDY signal is active. When ECC_CORR_EN is active that indicates that a sector that is represented at the head of the error correction queue 134 (current sector) has at least one byte of correction to be processed. ECC_CORR_EN is typically set active on or before the first clock of the active. ECC _BC _RDY signal for a current sector.

ECC_CORR_EN is also used to indicate if error logging will be executed (if enabled), and when error logging is complete. Once all the corrections contained in the present queue slot is transferred this signal would go inactive indicating the complete transfer of the logging data between the ECC module 109 and buffer controller 108. ECC_CORR_EN goes inactive, after the BC_ECC_DATEN signal (described below) that completes the last error corrections.

ECC_UNCORR_ERR:

This signal is also driven by ECC module 109 and defined after ECC_BC_RDY is active. When ECC_UNCOR_ERR is active (high) that indicates that the sector that is represented at the head of the correction queue 134 (current sector) incurred an uncorrectable error. When this signal is active, FIFO 120B data is written to buffer memory 111 without any corrections. ECC_UNCOR_ERR is typically active on or before ECC_B-C_RDY is active for a current sector.

When this signal is active the protocol between the buffer controller 108 and ECC 109 does not change except that no errors are applied.

ECC-MASK_LOG_DATA:

This signal is generated by ECC module 109. The signal may include error log data or error correction mask data. Each bit in the signal corresponds to the same bit stored in FIFO 120B, which includes Channel 0 (CH0). An active bit represents an inverted error bit, while an inactive bit represents a correct bit. Jointly the bits are referred as mask data.

ECC_MASK-DATA includes the mask at the beginning of the sector when ECC_BC_RDY is active following a single clock pulse of BCC_ECC_SECT_CMP, and BC_ECC_LO-G_EN is inactive. Mask data is updated in FIFO 120B for each clock when BC ECC DATEN is active, and BC_EC-C_LOG_EN is inactive.

The sector size may be a multiple of 4 bytes. In one aspect, FIFO 120B may accommodate 64 bits. When the sector size is an odd multiple of 4 bytes (for example 516 bytes) either the start or the end of the sector will occupy 32 bits of FIFO 120B. If the sector size is an even multiple of 4 bytes then every FIFO 120B address may have 64 bits of data.

Therefore, for odd sector size, the first sector will start out even (occupying 64 bits of FIFO 120B) and end odd (occupying 32 bits of FIFO 1208). If sector size is an even multiple of 4 bytes, the start and end of the sector will occupy 64 bits of FIFO 120B. ECC module 109 can predict odd and even ends based on sector size and keeps track of odd/even status from the beginning of a read operation.

BCC_ECC_DATAEN:

Buffer controller 108 drives this signal. When active (high) BC_ECC_DATEN indicates that ECC_MASK_LOG_DATA has been transferred between ECC module 109 and buffer controller 108 and should change the next clock to correct data for the next error correction mask or error log, depending on the state of BC_ECC_LOG_EN signal. When inactive it indicates that the ECC MASK LOG DATA should remain at the present value. This signal is active when ECC BC ROY is active.

BCC_ECC_LOGEN:

Buffer Controller 108 drives this signal. When active it indicates that the transferred ECC_MASK_LOG_DATA should be error logged. When this signal is inactive, it indicates that the ECC_MASK_LOG_DATA is for error correction.

BC_ECC_SECT_CMP:

Buffer controller 108 drives this signal. When active (high) it indicates that buffer controller 108 has completed a previous error correction queue 134. This signal is asserted for one clock to initiate error correction queue 134 for the next sector. BC_ECC_DATEN is inactive while this signal is active.

BC_CH0_FIFO_CLR:

Buffer Controller 108 drives this signal. When active (high) it indicates that buffer controller 108 has cleared FIFO 120B to the reset condition as follows: FIFO address pointers and FIFO counter are all zeroed, and the CH0 State Machines goes to idle. Any operational signals, which operate on an operational cycle basis, are cleared to the pre-operational or reset state. This includes CH0_LAST_BLOCK, CH0_ODD_START signals. When ECC module 109 receives BC_CH0_FIFO_CLR in the active state, it is to also reset to a pre-operational state. For example, ODD_START is cleared, the corrections queue is returned to an empty status. All state machines return to idle state.

Figure 7B:
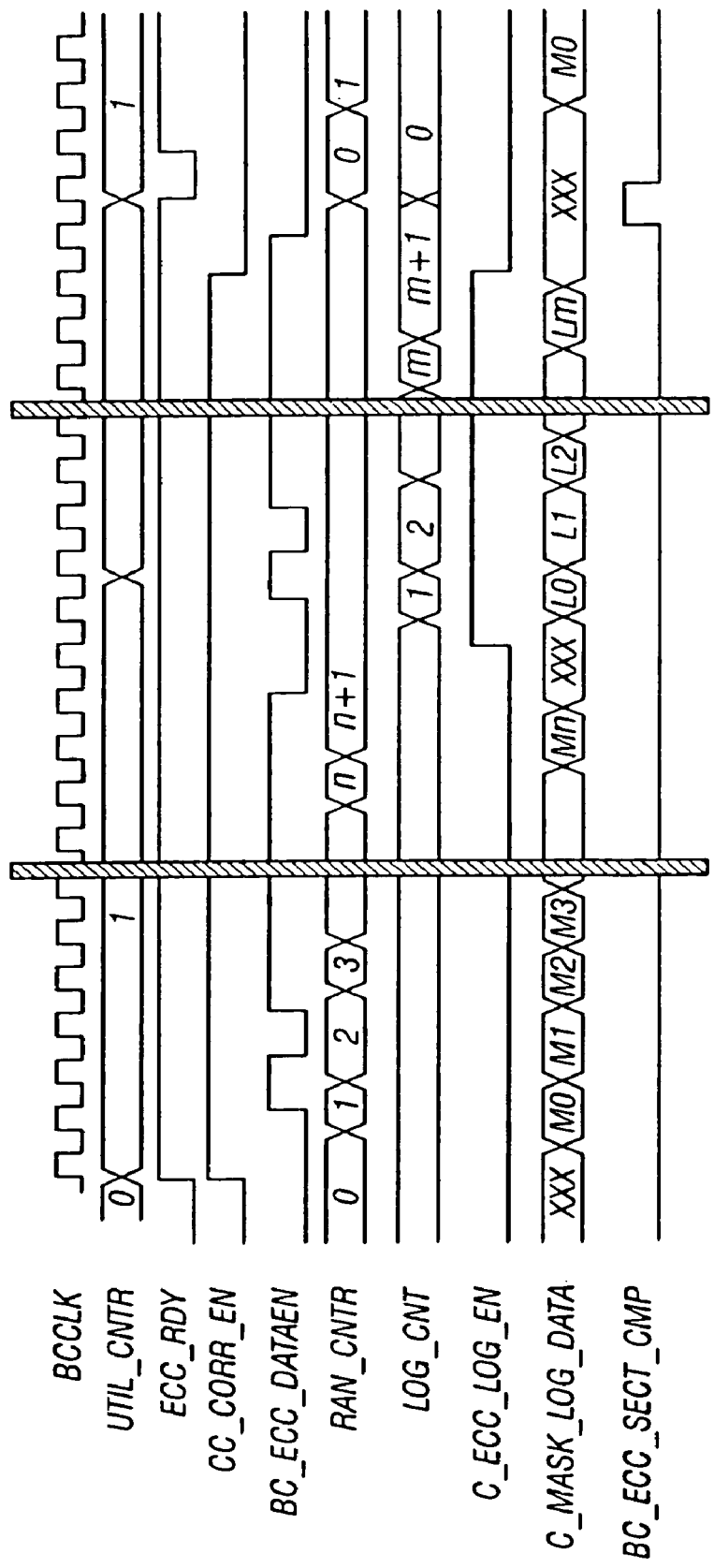
FIG. 7B is a timing chart showing plural signals of FIG. 7A, in one aspect of the present invention.

FIG. 7B shows an example of a timing chart involving some of the various signals discussed above.

Figure 8:
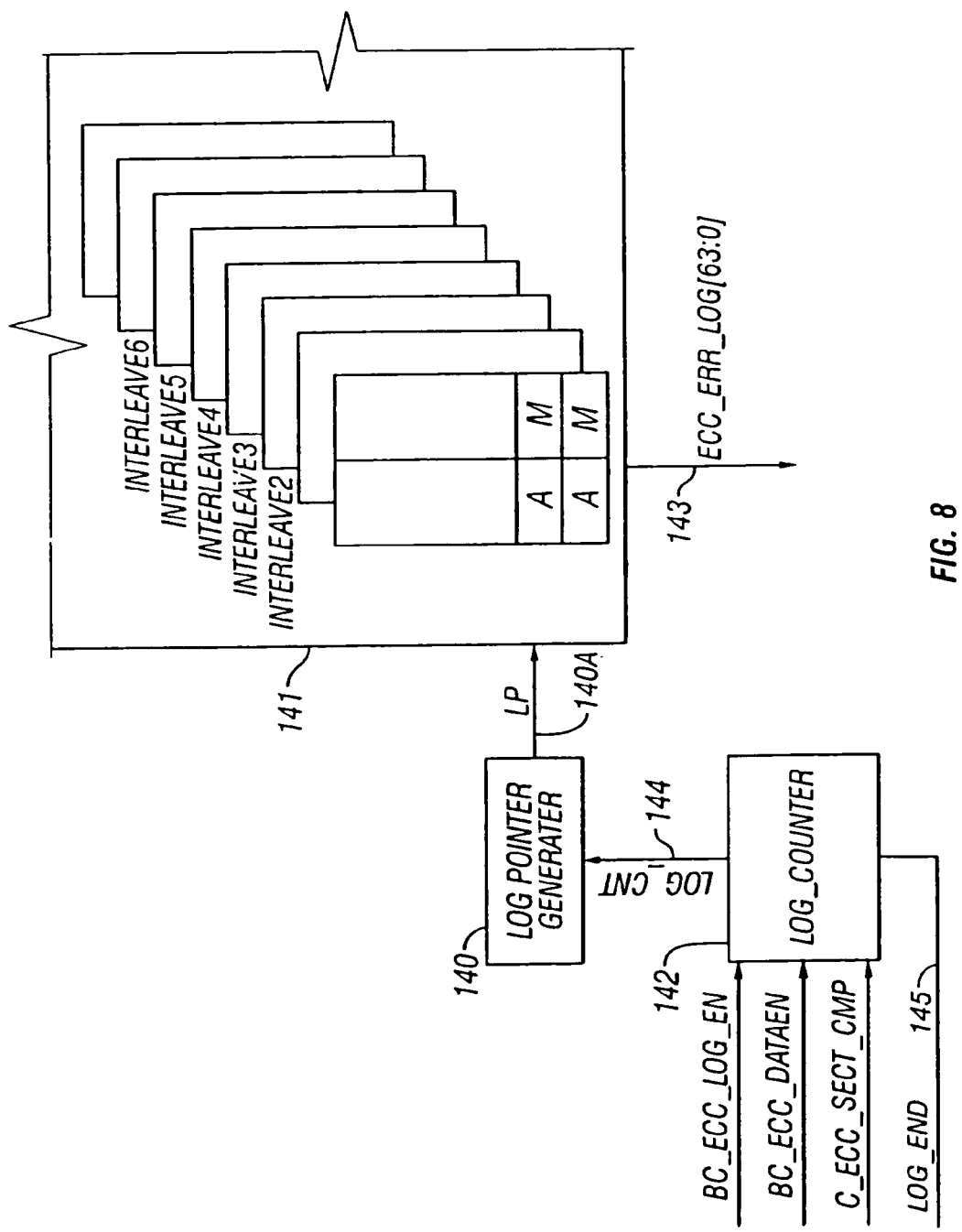
FIG. 8 shows a block diagram with components used for error logging, according to one aspect of the present invention.

FIG. 8 is a block diagram showing error logging module 135 components according to one aspect of the present invention. Error log counter 142 sends a command 144 to log pointer generator 140, and based upon whether a previous error is logged, log pointer generator generates pointer 140A to extract all the error information from plural interleaves 141. ECC-ERR-LOG 143 is an example of one such command that extracts all the error information and transfers to buffer memory 111 through buffer controller 108. In one aspect, log pointer generator 140 may be located in error logging module 135.

Figure 9:
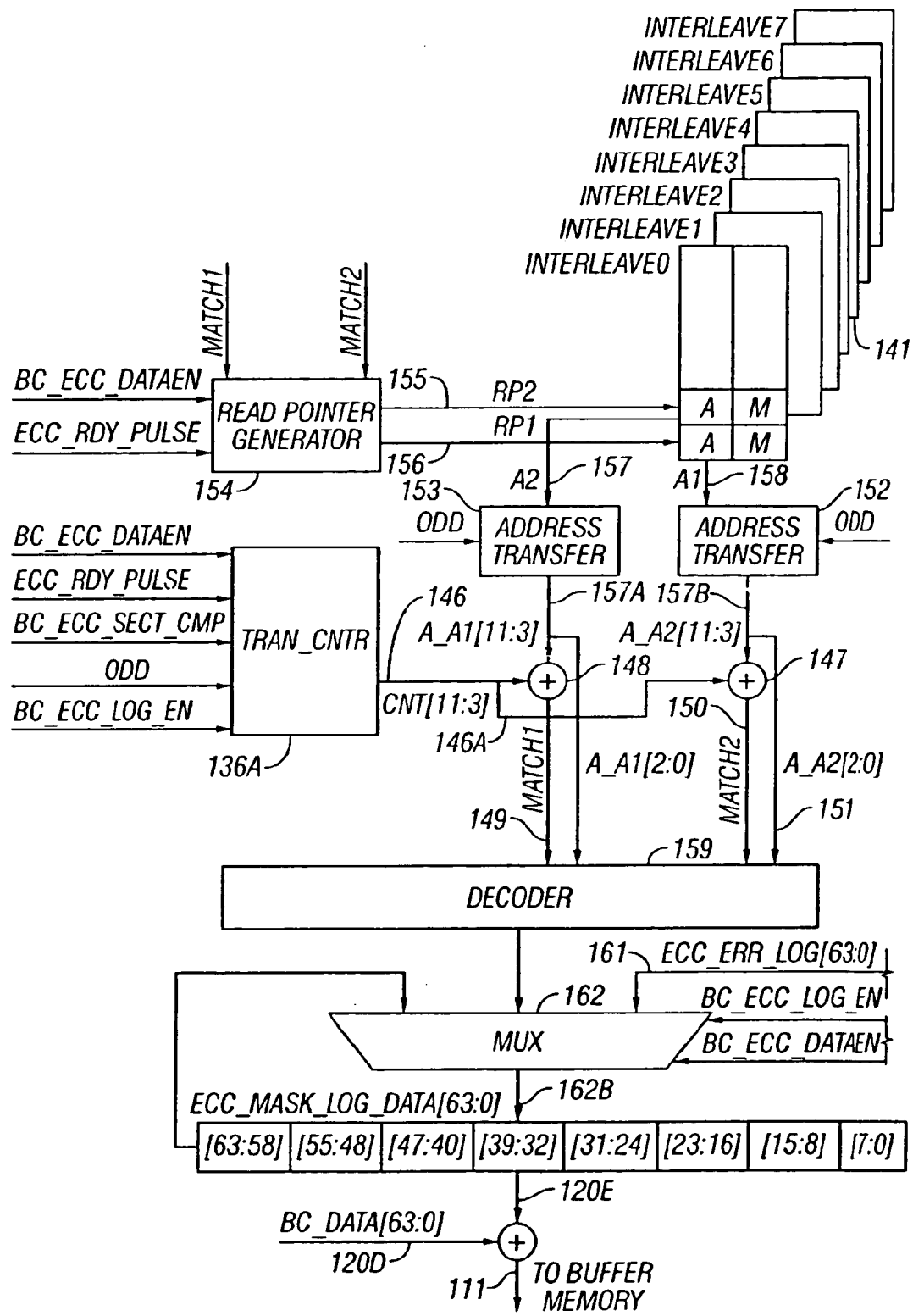
FIG. 9 is a block diagram showing various components used in in-line error correction, according to one aspect of the present invention.

FIG. 9 shows a detailed block diagram of various components used in the error correction process, some of which have been discussed above. Read pointers are generated by a read pointer generator 154 located within state machine 132. Read pointer generator 154 generates pointers 155 and 156 to obtain interleaved error location and error mask information from plural interleave banks 141. FIG. 9 shows such interleave banks 141 as Interleave 0, Interleave 1, Interleave 2, Interleave 3 and so forth.

Interleaved error location address from a particular interleave bank (e.g., interleave 0) is extracted as 157 and 158 respectively. Since addresses 157 and 158 are relative and interleaved, they are converted into absolute addresses 157A and 1578 by plural address converters 152 and 153. It is noteworthy that the present invention is not limited to any particular number of address converters.

In one aspect of the present invention, address converters 152 and 153 are located within transfer control module 136. Transfer counter 136A generates absolute data address 146 and 146A. In one aspect of the present invention, transfer counter 136A is located within transfer control module 136.

If data 146 and absolute error address 157A match, a mask signal 149 is sent to a decoder 159. Decoder 159 acquires mask information associated with absolute data 146 and error address 157A. Data and error mask 160 is transferred to a MUX 162. Mux output 162A is then applied to the data stored in sector 163 and is output as error correction data 120E. Error correction data 120E is then transferred to WR data path module 1201, where error correction data 120E is applied to uncorrected data 120D. In one aspect, WR data path module 1201 XOR's data 120D and 120E to generate corrected data 120F. Corrected data 120F is then sent to buffer memory 111 via register 120G.

Figure 10:
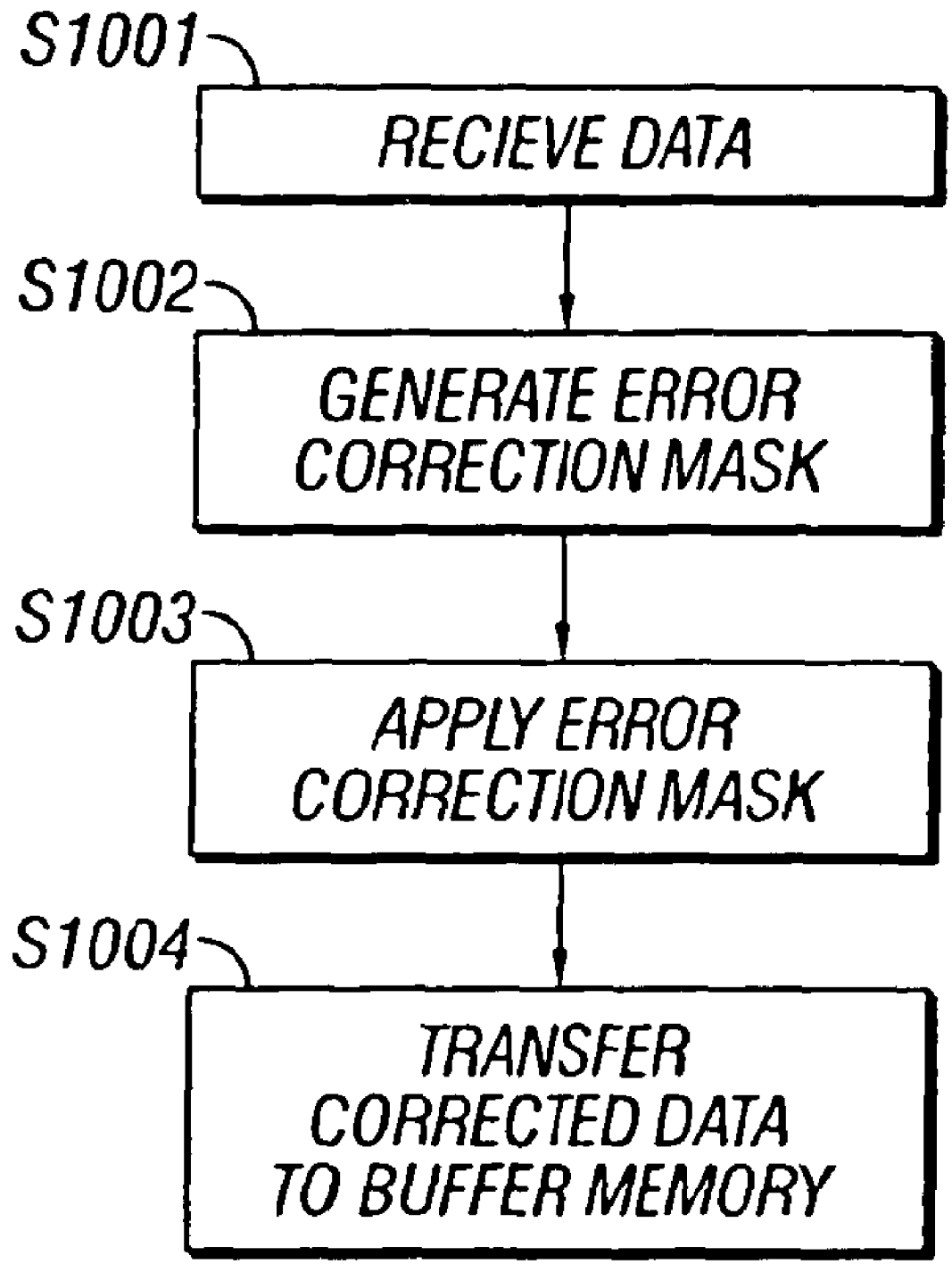
FIG. 10 is a flow diagram for in-line ECC, according to one aspect of the present invention.

FIG. 10 shows executable process steps to perform in-line ECC, according to one aspect of the present invention.

In step S1001, data is received from disk formatter 112. Data is received by FIFO 120B and GNCHK module 121, simultaneously.

In step S1002, error correction mask 120E is generated, as described above. The mask is generated prior to data being transferred to buffer memory 111.

In step S1003, error correction mask is applied to uncorrected data. In one aspect, WR data path module 1201 XOR's error correction mask 120E and uncorrected data 1200 to generate corrected data 120F, as shown in FIG. 2E.

In step S1004, corrected data 120F is transferred to buffer memory 111, via register 120G.

In one aspect of the present invention, error correction is performed before any data is transferred from the buffer controller to a buffer memory. This minimizes latency caused by error correction during a read operation.

Although the present invention has been described with reference to specific embodiments, these embodiments are illustrative only and not limiting. Many other applications and embodiments of the present invention will be apparent in light of this disclosure and the following claims.

What is claimed is:

1. A disk controller, comprising:
   a disk formatter configured to receive data being transferred between a disk and a host;
   a buffer controller in communication with (i) the disk formatter, (ii) a buffer configured to store the data being transferred between the disk and the host, and (iii) the host, wherein the buffer is external to each of the disk controller and the host, and wherein the buffer controller is configured to regulate transfer of the data between the buffer and the disk formatter; and
   an error correction module in communication with (i) the disk formatter and (ii) the buffer controller, wherein the error correction module is configured to generate an error correction mask to correct errors in the data, and wherein the error correction mask is applied to the data prior to the buffer controller transferring the data to the buffer, wherein the error correction module is configured to receive the data from the disk formatter while the buffer controller receives the data from the disk formatter.

2. The disk controller of claim 1, wherein the disk formatter is configured to send the data to each of the buffer controller and the error correction module.

3. The disk controller of claim 1, wherein the error correction module is configured to interleave the data according to one of a plurality of interleave modes.

4. The disk controller of claim 1, wherein the error correction module is configured to interleave and de-interleave the data.

5. The disk controller of claim 1, wherein the error correction module is further configured to generate an error location.

6. The disk controller of claim 5, wherein the error correction module is configured to interleave and de-interleave at least one of the error location and the error correction mask.

7. The disk controller of claim 1, wherein the buffer comprises a first in first out memory.

8. A method of operating a disk controller of a disk drive, the disk controller comprising (i) a disk formatter, (ii) a buffer controller, and (iii) an error correction module, the method comprising:
   receiving, at the disk formatter, data being transferred between a disk and a host;
   receiving, at the buffer controller, the data from the disk formatter, wherein the buffer controller regulates transfer of the data between (i) the disk formatter and (ii) a buffer external to each of the disk controller and the host, wherein the buffer is configured to store the data being transferred between the disk and the host; and
   generating, using the error correction module, an error correction mask to correct the data, wherein the error correction mask is applied to the data prior to the buffer controller transferring the data to the buffer, and wherein the data is received by the error correction module while the buffer controller receives the data from the disk formatter.

9. The method of claim 8, further comprising sending the data to each of the buffer controller and an error correction module.

10. The method of claim 8, further comprising interleaving the data according to one of a plurality of interleave modes.

11. The method of claim 8, further comprising interleaving and de-interleaving the data.

12. The method of claim 8, further comprising generating an error location.

13. The method of claim 12, further comprising interleaving and de-interleaving at least one of the error location and an error correction mask.

14. The method of claim 8, wherein the buffer includes a first in first out memory.

* * * * *